United States Patent
Sugimura

(10) Patent No.: US 7,606,038 B2
(45) Date of Patent: Oct. 20, 2009

(54) METHOD FOR PRODUCING A PRINTED CIRCUIT BOARD WITH A HEAT RADIATING STRUCTURE AND A PRINTED CIRCUIT BOARD WITH A HEAT RADIATING STRUCTURE

(75) Inventor: Yoshiaki Sugimura, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 69 days.

(21) Appl. No.: 11/903,154

(22) Filed: Sep. 20, 2007

(65) Prior Publication Data
US 2008/0186682 A1 Aug. 7, 2008

(30) Foreign Application Priority Data
Sep. 20, 2006 (JP) ............... 2006-253993

(51) Int. Cl.
*H05K 7/20* (2006.01)
(52) U.S. Cl. .............. 361/720; 361/704; 361/707; 361/719; 257/706; 257/707; 257/712
(58) Field of Classification Search ................ None
See application file for complete search history.

(56) References Cited

U.S. PATENT DOCUMENTS

| | | | |
|---|---|---|---|
| 5,708,566 A | 1/1998 | Hunninghaus et al. | |
| 5,923,084 A * | 7/1999 | Inoue et al. ............. | 257/712 |
| 6,043,986 A | 3/2000 | Kondo et al. | |
| 6,226,183 B1 * | 5/2001 | Weber et al. ............ | 361/704 |
| 6,335,862 B1 | 1/2002 | Koya | |
| 6,373,348 B1 * | 4/2002 | Hagerup ................. | 333/81 A |
| 6,770,967 B2 * | 8/2004 | Barcley ................... | 257/706 |
| 6,816,377 B2 * | 11/2004 | Itabashi et al. .......... | 361/704 |
| 6,820,798 B1 * | 11/2004 | Heinz et al. ............. | 228/254 |
| 6,867,493 B2 * | 3/2005 | Hashemi et al. ......... | 257/717 |
| 6,977,346 B2 * | 12/2005 | Jairazbhoy et al. ...... | 174/252 |
| 7,148,554 B2 * | 12/2006 | Nah et al. ............... | 257/532 |

(Continued)

FOREIGN PATENT DOCUMENTS

DE 19910500 10/2000

(Continued)

OTHER PUBLICATIONS

AN668 Application Note—A New High Power IC Surface Mount Package Family: PowerSO-20 & PowerSO-36 Power IC Packaging from Insertion to Surface Mounting—by P. Casati & C. Gongnetti—Jul. 2001—pp. 1-19.

*Primary Examiner*—Boris L Chervinsky
(74) *Attorney, Agent, or Firm*—Gerald E. Hespos; Anthony J. Casella

(57) ABSTRACT

A first surface of a double-sided printed circuit board has a soldering land for heat radiation, which serves as a mounting surface for an electronic part. A land for solder absorption is formed on the second surface facing the mounting surface. Viaholes are provided and open in both the soldering land for heat radiation and the land for solder absorption at the opposite ends. Molten solder flows out from the openings of the viaholes and spreads on the land for solder absorption to suppress formation of solder balls. Cream solder is applied to the outer surface of the land for solder absorption to embed the solder and to form a solder layer.

7 Claims, 9 Drawing Sheets

U.S. PATENT DOCUMENTS

| | | | |
|---|---|---|---|
| 7,259,448 B2 * | 8/2007 | Zhang et al. | 257/678 |
| 7,269,017 B2 * | 9/2007 | Berlin et al. | 361/719 |
| 7,298,043 B2 * | 11/2007 | Yui | 257/713 |
| 7,510,108 B2 * | 3/2009 | Lawlyes et al. | 228/179.1 |
| 2002/0131240 A1 | 9/2002 | Kim | |
| 2004/0042180 A1 | 3/2004 | Yamaguchi | |
| 2006/0007661 A1 * | 1/2006 | Iketaki | 361/719 |

FOREIGN PATENT DOCUMENTS

| | | |
|---|---|---|
| EP | 0139431 | 9/1985 |
| EP | 0920055 | 6/1999 |
| JP | 63-98675 | 6/1986 |
| JP | 2-11391 | 1/1990 |
| JP | 4-137691 | 5/1992 |
| JP | 6-268341 | 9/1994 |
| JP | 9-148691 | 6/1997 |
| JP | 11-68262 | 3/1999 |
| JP | 2001-168476 | 6/2001 |
| JP | 2002-192688 | 7/2002 |
| JP | 2004-127992 | 4/2004 |

* cited by examiner

METHOD FOR PRODUCING A PRINTED CIRCUIT BOARD WITH A HEAT RADIATING STRUCTURE AND A PRINTED CIRCUIT BOARD WITH A HEAT RADIATING STRUCTURE

BACKGROUND OF THE INVENTION

1. Field of the Invention

The invention relates to a heat radiating structure of a printed circuit board and a printed circuit board producing method and is particularly designed to improve the heat radiating capability of a heat generating electronic part, such as an IC chip, to which a large current is applied and to prevent an occurrence of problems at the time of producing a printed circuit board having the heat radiating capability.

2. Description of the Related Art

A printed circuit board has a mounting surface for receiving and electronic part. The mounting surface has a land for soldering the electronic part. A through hole is formed in the land and heat is radiated to the other surface through the through hole.

For example, Japanese Unexamined Patent Publication No. H09-148691 and FIGS. 8(A), 8(B) and 8(C) herein disclose a heat generating element 1 mounted on a double-sided circuit board 2. More particularly, the circuit board 2 has opposite first and second surfaces 2a and 2b. A first copper foil flat pattern 3 is provided the first surface 2a of the circuit board 2 and the underside of the heat generating element 1 is secured to the first copper foil flat pattern 3 using solder or paste. The first copper foil flat pattern 3 is connected electrically to a second copper foil flat pattern 5 on the second surface 2b through viaholes 4. Conductive layers 4a are formed on the inner circumferential surfaces of the viaholes 4 by plating. Thus, heat generated by the heat generating element 1 is radiated from the second copper foil flat pattern 5 on the second surface 2b via the first copper foil flat pattern 3 and viaholes 4 is transferred efficiently from the first copper foil flat pattern 3 through the viaholes 4 and is radiated from the second copper foil flat pattern 5 on the second surface 2b. However, Japanese Unexamined Patent Publication No. H09-148691 simply discloses that the heat generating element 1 is secured to the copper foil flat pattern 3 using paste, solder or the like, and a specific securing method using solder or paste is unclear.

Further, Japanese Unexamined Patent Publication No. 2004-127992 discloses a printed circuit board with through holes that penetrate from the top surface to the under surface. The under surface is placed on a base plate. A resin paste is printed from the topside by a squeegee so that the resin paste fills the through holes and prevents solder flowing into the through holes from forming protuberances at the underside.

The method of using a paste or solder for securing the heat generating element 1 and the copper foil flat pattern 3 to a printed circuit board having the conductor patterns on both surfaces is unclear in Japanese Unexamined Patent Publication No. H09-148691. FIGS. 9A to 9D show how molten solder might flow into the viaholes 4 while securing the copper foil flat pattern 3 to the heat generating element 1 provided with a heat sink for heat radiation and electrical connection on the underside thereof. In such a case, the molten solder might be solidified at the underside and so-called solder balls 7a might project at the underside.

Specifically, cream solder 7 is applied to lands 6 that are solder-connected to lead terminals 1a of a heat generating element 1 on one surface 2a of a circuit board 2 and a copper foil flat pattern 3 for heat radiation as shown in FIG. 9A; a first reflow process is carried out by heating the circuit board 2 with the heat generating element 1 placed on the upper surface thereof as shown in FIG. 9(B); and the lead terminals 1a of the heat generating element 1 and the underside of the heat generating element 1 are soldered respectively to the lands 6 and the copper foil flat pattern 3.

The solder applied to the copper foil flat pattern 3 melts and can flow into the viaholes 4. Thus, the solder may spill from the openings surrounded by a copper foil flat pattern 5 on the second surface 2b, and solidifies as the solder balls 7a shown in FIG. 9C.

In this state, a second reflow process is carried out after cream solder is applied to the lands on the second surface 2b so that the copper foil pattern on the second surface 2b is soldered to terminals and an electronic part.

At this time, a metal mask 9 is mounted and the cream solder is applied by a squeegee 10 as shown in FIG. 9(D). However, the solder balls 7a cause the metal mask 9 to become uneven. Thus, the metal mask 9 and squeegee 10 may be damaged while applying the cream solder.

The heat of the reflow process separates the cream solder into solder and flux for facilitating the soldering. The flux flows into the viaholes 4 together with the molten solder to adhere to the copper foil flat pattern 5 on the underside. The flux is adhesive, and hence the metal mask becomes difficult to remove after the cream solder is applied with the metal mask mounted on the second surface, which presents a problem of reducing operability.

The through holes may be filled beforehand to prevent the formation of the solder balls 7a to close the through holes, as disclosed in Japanese Unexamined Patent Publication No. 2004-127992. However, this leads to an increased production cost because a resin applying step needs to be added.

The present invention was developed in view of the above problems, and an object thereof is to prevent improve the production process of a printed circuit board.

SUMMARY OF THE INVENTION

Accordingly, solder that flows into viaholes is prevented from being formed into solder balls. Thus, a metal mask does not become uneven and the metal mask and a squeegee used for cream application are not damaged when mounting the metal mask to apply cream solder to lands.

The invention relates to a method for producing a printed circuit board with opposite first and second surfaces and at least one heat radiating structure. The method includes preparing the printed circuit board with at least one conductor pattern and at least one land made of conductive foil formed on one or both surfaces of an insulating substrate. At least one soldering land for heat radiation is formed on a part of the first surface and defines a mounting surface for an electronic part. At least one land for solder absorption is formed on the second surface. At least one viahole has opposite ends that open in the soldering land for heat radiation and the land for solder absorption. The method then includes placing a metal mask on the first surface and applying cream solder to the lands and the soldering land portion for heat radiation. The method continues by placing the electronic part on the first surface, melting the cream solder in a first reflow process to solder-connect lead terminals of the electronic part and the respective lands, causing the molten solder leaking out towards the second surface through the viaholes to flow to the land for solder absorption and to adhere near the openings in a substantially flat manner, placing a metal mask on the second surface of the printed circuit board, applying cream solder to the land for solder absorption to cover the solder solidified near the openings of the viaholes, and melting the cream solder in a second reflow process to form a solder layer on the land for solder absorption.

According to a preferred embodiment of the invention, the method further comprises forming at least one solder resist on solder unnecessary parts of the printed circuit board to surround at least part of the soldering land for heat radiation and/or the land for solder absorption.

The first reflow process preferably comprises forming a solder layer adhering to the soldering land for heat radiation and the underside of the electronic part.

As described above, the solder melted in the first reflow process may flow into the viaholes and may leak out from the openings at the second surface. However, the land for solder absorption is provided at these openings and exposes the foil. Thus, the leaked-out solder spreads along the outer surface of the foil and deposits at the peripheries of the openings in a flat manner without forming solder balls. The absence of solder balls assures that the metal mask mounted on the second surface of the printed circuit board will not deform to become uneven. In addition, the cream solder also is applied to the land for solder absorption and the metal mask is formed with openings in a part corresponding to the land for solder absorption. Therefore the metal mask does not become uneven.

Damage of a squeegee and the metal mask can be prevented in the process of applying the cream solder to the upper surface of the metal mask by the squeegee. Further, the metal mask is not mounted on the land for solder absorption. Hence, there is no likelihood that the metal mask adheres because of flux and is made difficult to remove. In this way, problems that have occurred in the conventional production process can be solved, and production costs can be reduced by improving production efficiency.

A thickness of the cream solder applied for the first reflow process preferably is substantially equal to the thickness of the metal mask used in connection therewith.

The molten solder leaking through the viaholes and towards the second surface preferably forms solder deposited portions having a projecting height that is smaller than thickness of the metal mask used in connection with the second reflow process.

Cream solder for the second reflow process preferably is applied to the land for solder absorption up to substantially the same height as the metal mask while at least partly covering solder deposited portions near the openings of the respective viaholes.

The invention also relates to a heat radiating structure for a double-sided circuit board having conductor patterns on one or both surfaces. At least one soldering land for heat radiation is provided in an area of a second surface of the printed circuit board facing the underside of an electronic part. Viaholes penetrate the printed circuit board. Each viahole has one end that opens in the soldering land for heat radiation. At least one land for solder absorption is provided on the second surface of the printed circuit board at the viaholes. At least one solder layer is formed by reflowing cream solder applied to the soldering land for heat radiation between the underside of the electronic part and the soldering land for heat radiation. The melted solder leaks out through the viaholes, spreads on the land for solder absorption and adheres to the land for solder absorption in a substantially flat manner. The solder layer formed by reflowing the cream solder applied in a manner to cover the solder adhering in the substantially flat manner is provided on the land for solder absorption.

The heat radiating structure for the printed circuit board preferably is produced by the above-described producing method.

Specifically, it is preferable that the land for solder absorption faces the soldering land for heat radiation in the thickness direction of the printed circuit board while having substantially the same area as the soldering land for heat radiation.

Moreover, several viaholes preferably are arranged at specified intervals in forward and backward directions and/or transverse direction. The outer edge of the land for solder absorption is at a specified distance from the viaholes located at the outer ends in forward and backward direction and/or transverse direction.

The land for solder absorption has a wide area including the openings of all the viaholes and the outer edge thereof is at the specified distance from the openings of the viaholes located closest to this outer edge. Thus, molten solder and flux leaking from the openings of the viaholes is cannot adhere to the outer surface of the solder resist at the outer periphery.

Lead terminals preferably project from the outer side surface of the electronic part and are solder-connected to respective land portions provided on the one surface of the printed circuit board. The electronic part includes a heat radiating member formed of a radiation slug or heat sink on the underside thereof, and the solder layer on the soldering land for heat radiation is secured in surface contact with the heat radiating member.

The electronic part is provided with the heat radiating member on its underside, and the heat radiating member can be brought reliably substantially into surface contact with the solder layer formed on the outer surface of the soldering land for heat radiation. Therefore the heat radiating property of the electronic part can be improved.

As described above, the soldering land for heat radiation is provided at the underside of the electronic part generating heat and the land for solder absorption is provided on the other surface electrically connected to the soldering land through the viaholes. Solder in the solder layer between the underside of the electronic part and the soldering land for heat radiation is melted by heating and may leak out to the other side through the hollow parts of the viaholes. This solder spreads along the surface of the land for solder absorption and preventing the formation of protuberant solder balls. As a result, damage to the metal mask and squeegee can be prevented when the metal mask is mounted on the other surface and the cream solder is applied by the squeegee. Therefore, production efficiency can be improved.

These and other objects, features and advantages of the invention will become more apparent upon reading of the following detailed description of preferred embodiments and accompanying drawings. It should be understood that even though embodiments are separately described, single features thereof may be combined to additional embodiments.

BRIEF DESCRIPTION OF THE DRAWINGS

FIG. 1 show an essential portion of a printed circuit board according to the invention, wherein

FIG. 2 show a circuit board with double-sided conductor patterns and viaholes showing a method for producing the printed circuit board, wherein

DETAILED DESCRIPTION OF THE PREFERRED EMBODIMENTS

Figure 1A:
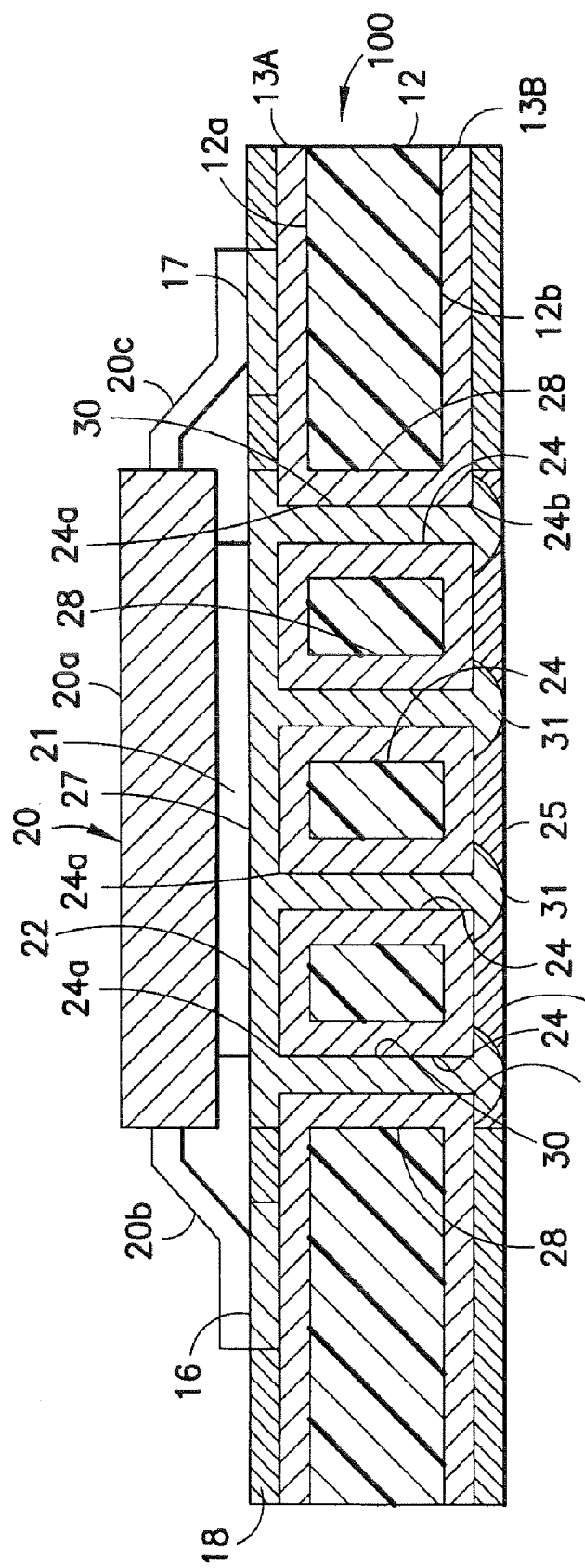
FIG. 1(A) is a section.
Figure 1B:
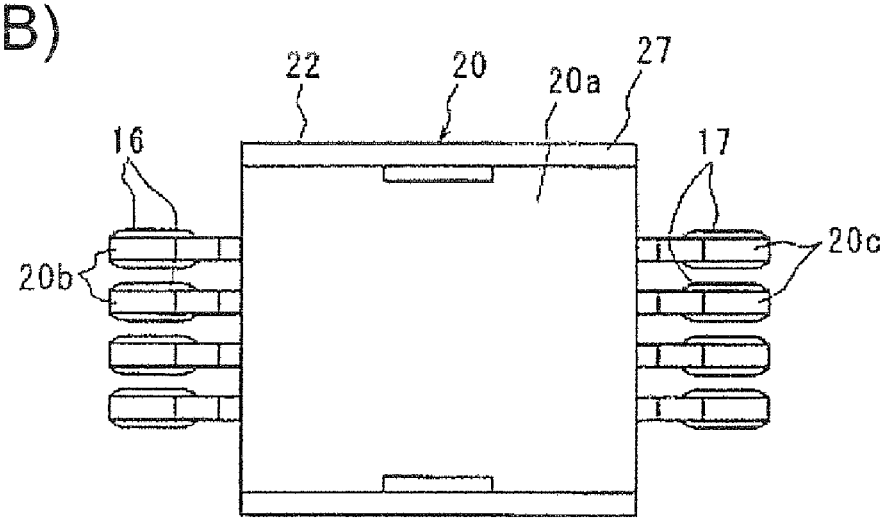
FIG. 1(B) is a plan view and FIG. 1(C) is a bottom view.
Figure 1C:
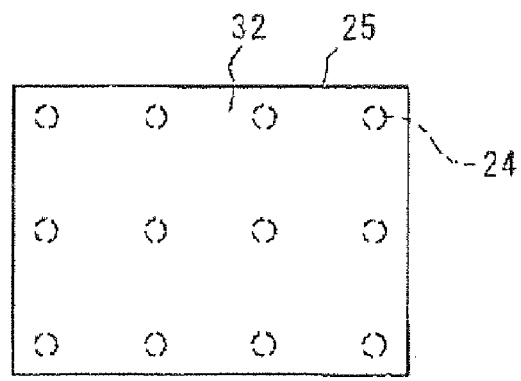

A double-sided printed circuit board in accordance with the invention is identified by the numeral 100 in FIG. 1(A). The circuit board 100 has a substrate 12 with opposite first and second surfaces 12a and 12b. The substrate 12 is made of an insulating material, such as epoxy. First and second conductor patterns 13A and 13B are provided respectively on the first and second surfaces 12a, 12b of the insulating substrate 12. The conductor patterns 13A and 13B are made of conductive material, preferably conductive foil material, such as copper foil, and are referred to collectively by the numeral 13. An electronic part 20 is mounted on the first surface 12a. The electronic part 20 includes an IC chip to which a large current can be applied.

Lead terminals 20b, 20c project from the bottom left and right surfaces of a case 20a of the electronic part 20, and a heat sink 21 is attached to a surface of the electronic part 20 that faces towards first surface 12a of the substrate 12 of the printed circuit board 100. The lead terminals 20b, 20c of the electronic part 20 are solder-connected to lands 16, 17 of the conductor patterns on the first surface 12a for mounting the electronic part 20 on the first surface 12a.

A soldering land 22 for heat radiation is defined by exposing the copper foil on the first surface 12a of the substrate 12 of the printed circuit board 100. Thus, the soldering land 22 for heat radiation faces the mounting side of the electronic part 20 where the heat sink 21 is provided. The soldering land 22 for heat radiation is surrounded by a solder resist 18. Viaholes 24 are formed through the substrate 12. Each viahole 24 has a first opening 24a at a portion of the first surface 12a of the substrate 12 corresponding to the soldering land 22 for heat radiation. Each viahole 24 also has a second opening 24b at the second surface 12a of the substrate 12. The viaholes 24 are arranged to define a matrix array at substantially the same intervals in forward and backward directions and transverse directions. In this embodiment, as shown in FIG. 2, four viaholes 24 are arranged in transverse direction and three are arranged in forward and backward directions to provide a total of twelve viaholes 24. However, the number of the viaholes 24 can be suitably selected according to the size of the electronic part 20 and/or the heat to be dissipated. Each viahole 24 has a conductive inner surface formed, for example, by plating (e.g. "Through Hole Plated" (TH-Plated)). The viaholes 24 are not used as component holes, but rather serve as interlayer connections for connecting conductive layers or patterns on the two surfaces 12a and 12b.

The copper foil at portions of the second surface 12b of the substrate 12 adjacent the second openings 24b of the viaholes 24 is exposed to define a land 25 for solder absorption. The land 25 for solder absorption has substantially the same area as the soldering land 22 for heat radiation and the two lands 22, 25 are substantially registered in the thickness direction TD.

The outer periphery of the land 25 for solder absorption is determined by a solder resist 26 and is at a specified distance L from the viaholes 21 closest to this outer periphery. The land 25 for solder absorption and the soldering land 22 for heat radiation have substantially the same rectangular shape as the outer shape of the case 20a of the electronic part 20.

A solder layer 27 formed by reflowing cream solder is provided between the soldering land 22 for heat radiation and the heat sink 21 on the side where the electronic part 20 is to be mounted. The solder that becomes molten during reflowing flows as part of a first unitary solder matrix into the first openings 24a of the viaholes 24, along hollow parts enclosed by conductive layers 28 plated on the inner circumferential surfaces of the viaholes 24, out through the second openings 24b of the viaholes 24 and onto the soldering land 22 for heat radiation. As a result, the hollow parts of the viaholes 24 are filled with solder 30. The solder 30 that flows out from the second openings 24b of the viaholes 24 spreads along the copper foil surface of the land 25 for solder absorption to define substantially flat and low mountain-shaped solder depositions 31. The lateral extension of each solder deposition 31 is at least about three times more than the height extension, more preferably at least about four times and most preferably at least about five times.

A second unitary matrix of solder 32 is provided on the land 25 for solder absorption by applying the cream solder sufficiently to cover the solder depositions 31 and then reflowing the cream solder.

The method for producing the double-sided printed circuit board 100 is illustrated in FIGS. 2 to 7. More particularly, the insulating substrate 12 is provided with copper foils laminated onto both opposite surfaces 12a, 12b. Through holes are formed at specified positions on the insulating substrate 12 by a drill, a laser cutting tool or the like. The conductive layers 28 are formed on the inner circumferential surfaces of the through holes by plating to form the viaholes 24. Further, the copper foil patterns 13A, 13B are formed to have specified circuit configurations on both surfaces 12a, 12b of the circuit board preferably by etching. Subsequently, the solder resists 18, 26 are formed on the surfaces 12a, 12b while leaving the soldering portions to attain the state shown in FIGS. 2(A) to 2(C).

Figure 2A:
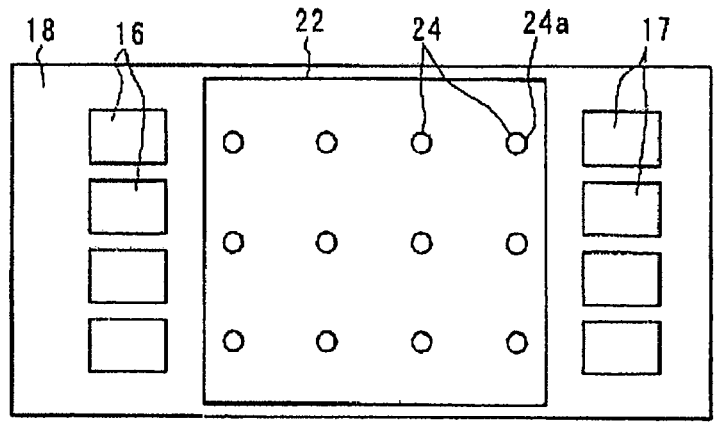
FIG. 2(A) is a plan view.
Figure 2B:
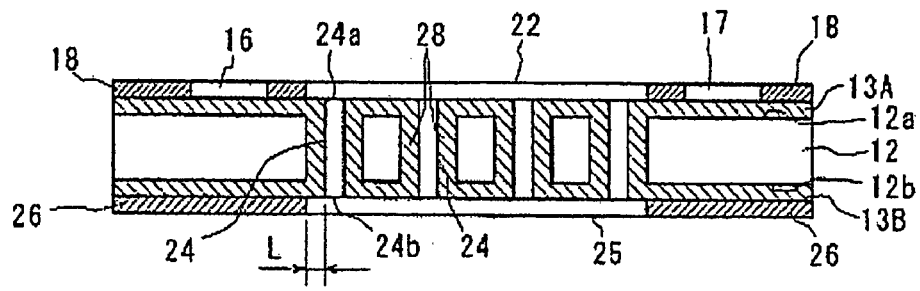
FIG. 2(B) is a section and FIG. 2(C) is a bottom view.
Figure 2C:
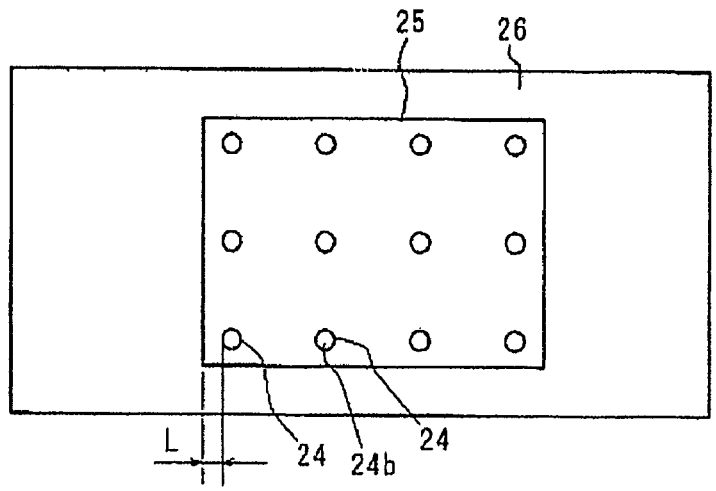

As shown in FIGS. 2(A) to 2(C), the substantially rectangular soldering land 22 for heat radiation is formed on the first surface 12a of the substrate 12 and substantially surrounds the first openings 24a of the viaholes 24 to define an area that will substantially face a placing portion of the electronic part 20. The soldering land portion 22 for heat radiation is surrounded by the solder resist 18. Further, the copper foils of the lands 16, 17 for solder connection with the lead terminals of the electronic part 20 are exposed at the opposite left and right sides of the soldering land 22 for heat radiation.

On the other hand, the land 25 for solder absorption is formed on the second surface 12b to surround the second openings 24b of the viaholes 24 and is surrounded by the solder resist 26. The land 25 for solder absorption has substantially the same shape as the soldering land 22 for heat radiation and is registered with the soldering land 22 in the thickness direction TD of the insulating substrate 12.

Figure 3:
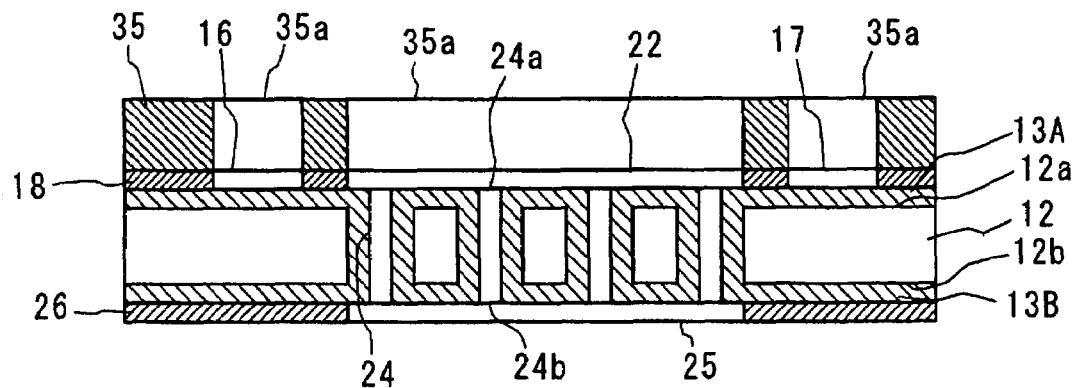
FIG. 3 is a section showing a state where a metal mask is mounted on one surface of the printed circuit board of FIG. 2.

A metal mask 35 is mounted to expose only the soldering portion on the first surface 12a where the electronic part 20 is to be mounted, as shown in FIG. 3. The metal mask 35 has openings 35a in its surface facing parts where the solder resist 18 is not provided, i.e. the soldering land 22 for heat radiation and the lands 16, 17.

Figure 4A:
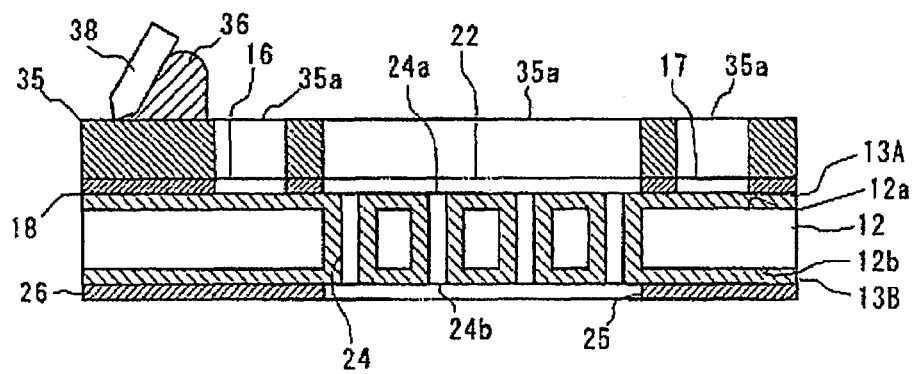
FIGS. 4(A) and 4(B) are sections showing a state where cream solder is applied with the metal mask mounted.
Figure 4B:
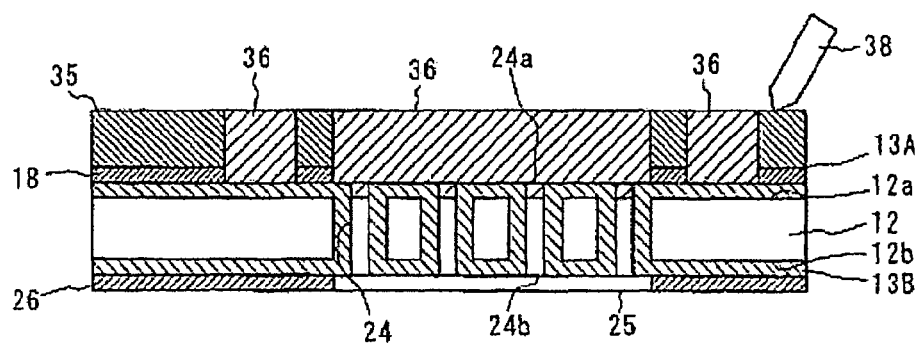

Subsequently, cream solder 36 is put on a side of the outer surface of the metal mask 35 and is applied to the outer surface of the metal mask 35 by a squeegee or resilient scraping tool 38 as shown in FIGS. 4(A) and 4(B). The cream solder 36 is applied to the outer surfaces of the soldering land 22 for heat radiation and to the lands 16, 17 at the openings 35a. The thickness of the applied cream solder 36 substantially equals the thickness of the metal mask 35. The metal mask 35 is removed after the cream solder 36 is applied.

Figure 5:
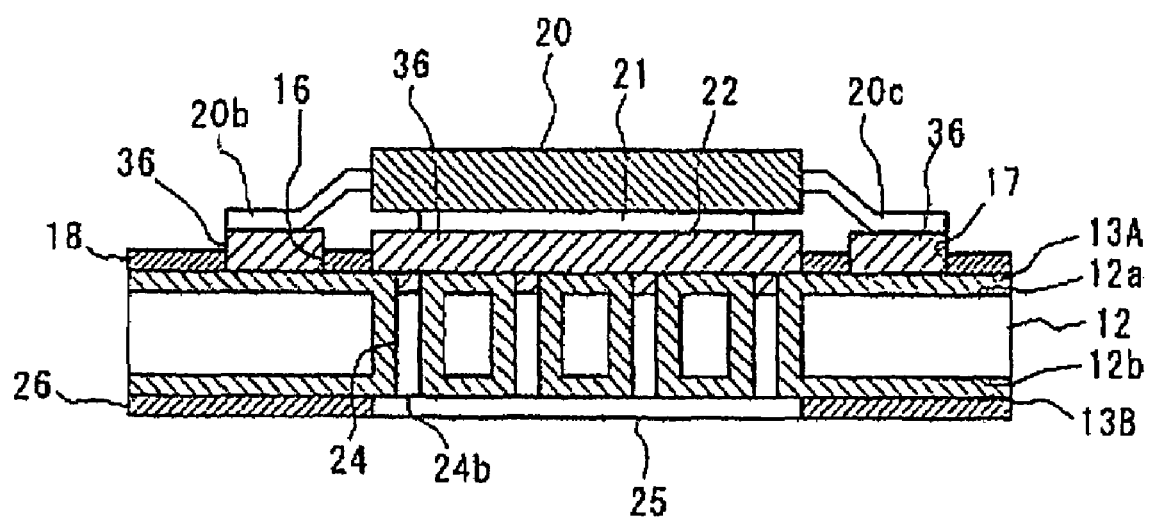
FIG. 5 is a section showing a state where an electronic part is placed after the application of the cream solder.

The electronic part 20 then is placed as shown in FIG. 5 so that the leading terminals 20b, 20c contact with the cream solder 36 on the outer surfaces of the lands 16, 17, and the heat sink 21 on the underside of the electronic part 20 contacts the outer surface of the cream solder 36 on the outer surface of the soldering land 22 for heat radiation.

Figure 6:
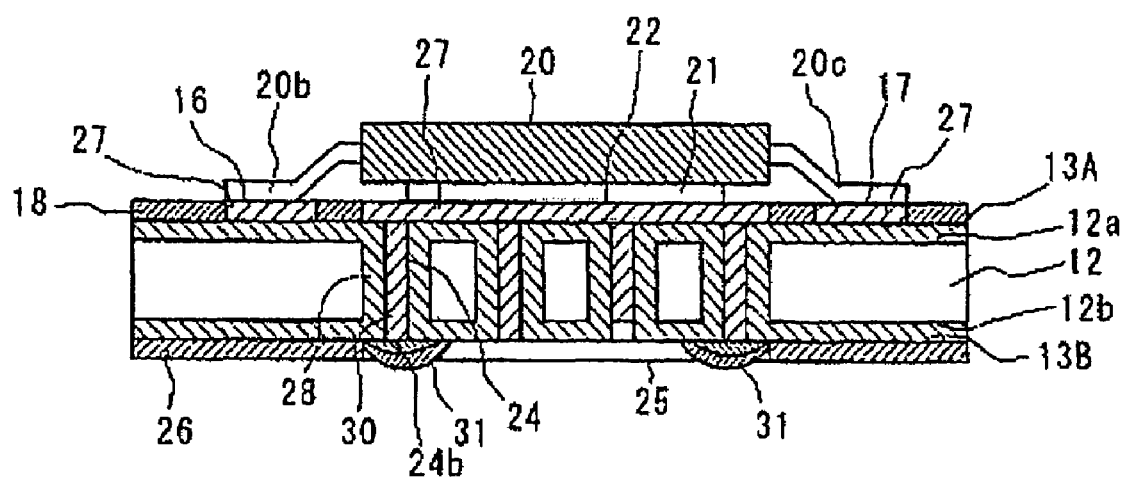
FIG. 6 is a section showing a state of a first reflow process.

Heating then is performed at a specified temperature using heating means (not shown) to melt the cream solder 36 to perform a first reflow process. Thus, the lead terminals 20b, 20c of the electronic part 20 are solder-connected to the lands 16, 17 using the solder in the cream solder 36, as shown in FIG. 6.

Further, the cream solder 36 applied on the soldering land 22 for heat radiation melts to adhere the heat sink 21 and the copper foil of the soldering land 22 for heat radiation. The cream solder 36 solidifies upon removal from the reflow oven to become the solder layers 27.

The molten cream solder 36 flows into hollow parts of the viaholes 24 exposed at the soldering land 22 for heat radiation and fills the hollow parts while adhering to the conductive layers 28 on the inner circumferential surfaces. The solidified cream solder 36 becomes the solders 30.

The molten solder that flows into the viaholes 24 may also flow out from the second openings 24b at the land 25 for solder absorption, but spreads along the copper foil because the copper foil is exposed on the surface of the land 25 for solder absorption. As a result, the molten solder spreads to form flat mountain-shaped projections about the openings 24b instead of becoming protuberant solder balls as in the prior art.

The flat solder depositions 31 are formed at the second openings 24b of the viaholes 24 at the land 25 for solder absorption when the molten solder is solidified and are part of a unitary matrix of solder that extends through the viaholes 24. The height of the solder depositions 31 is smaller than thickness "t" of a metal mask 40.

Figure 7A:
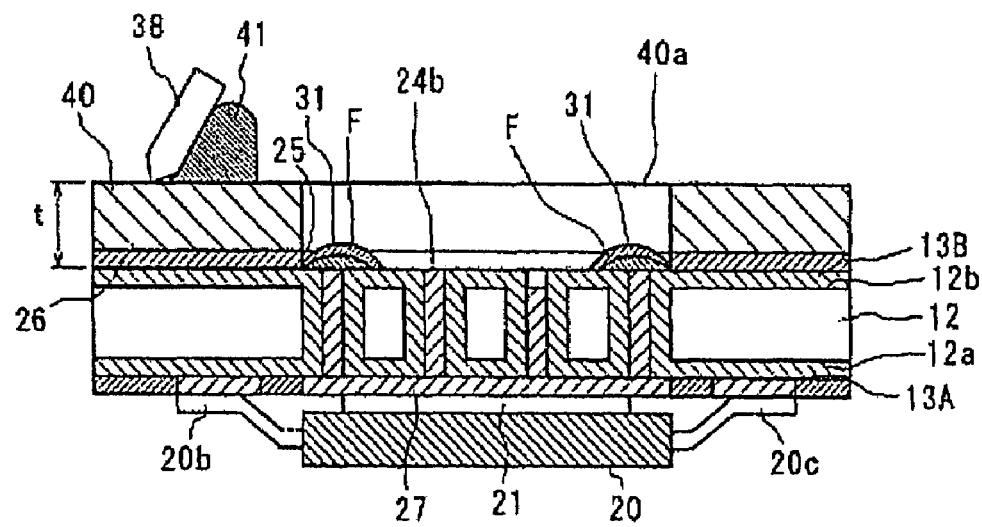
FIGS. 7(A) and 7(B) are sections showing a state where a metal mask is mounted on the other surface and cream solder is applied.
Figure 7B:
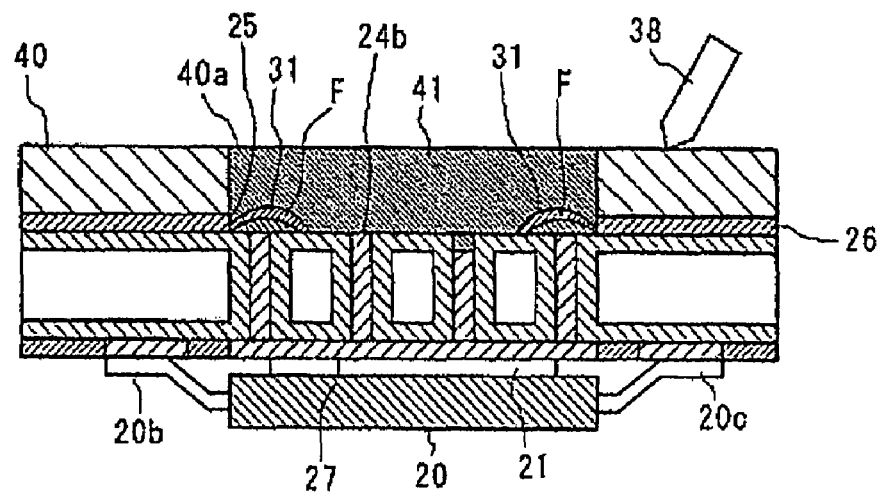
Figure 8A:
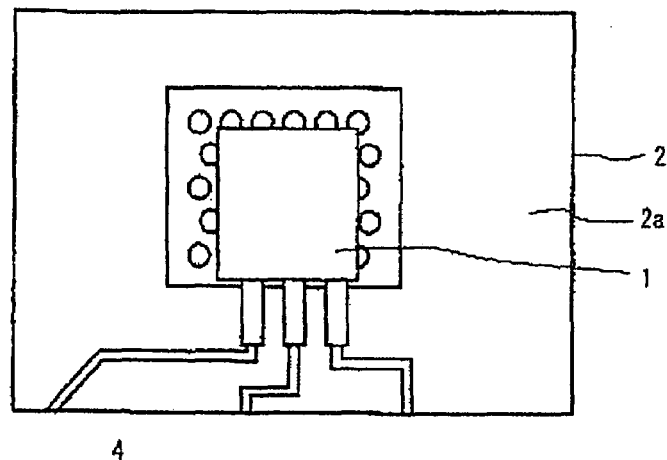
FIGS. 8(A) to 8(C) are sections showing a prior art.
Figure 8B:
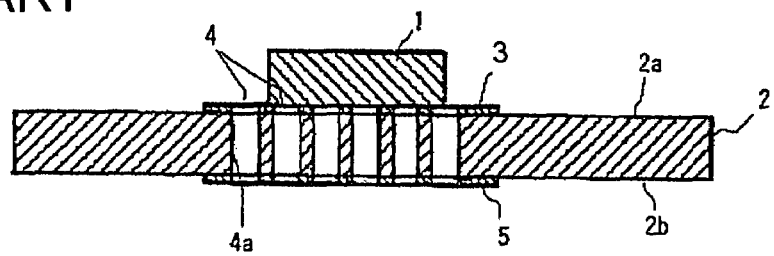
Figure 8C:
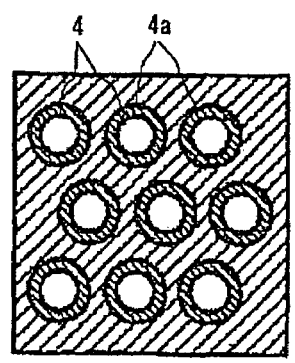
Figure 9A:
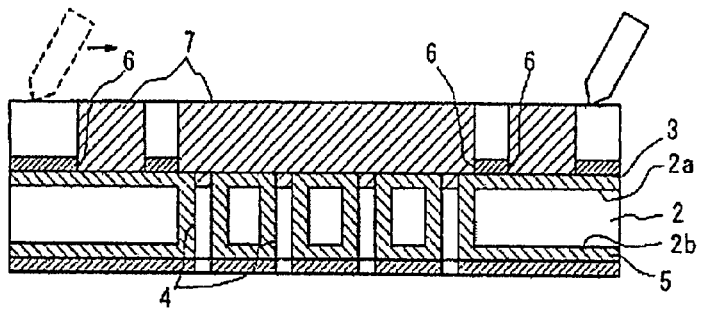
FIGS. 9(A) to 9(D) show a conventional producing method.
Figure 9B:
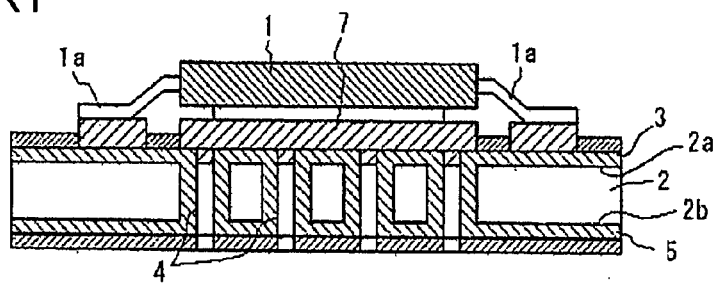
Figure 9C:
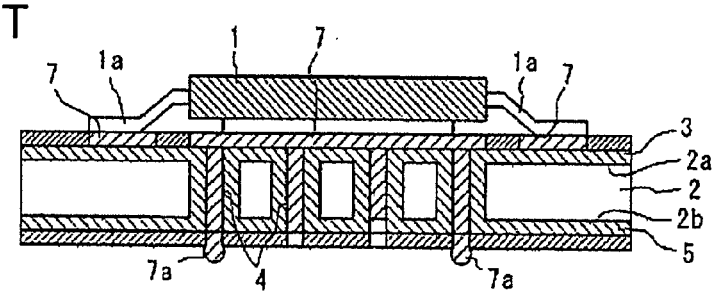
Figure 9D:
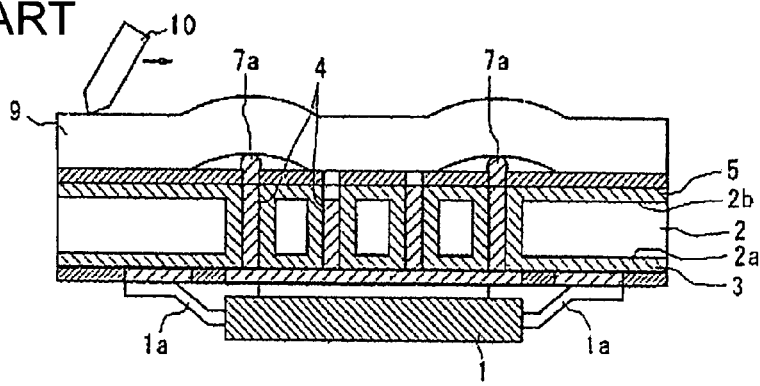

The metal mask 40 then is mounted on the second surface 12b and cream solder 41 is applied by the squeegee 38, as shown in FIGS. 7(A) and 7(B).

The metal mask 40 has an opening 40a facing the land 25 for solder absorption, and the height of the solder depositions 31 is shorter than the height of the metal mask 40. Thus, the metal mask 40 can cover in a flat state substantially without becoming uneven due to solder balls as in the prior art. Accordingly, the cream solder 41 can be applied smoothly without damaging the metal mask 40 and squeegee 38.

The cream solder 41 is applied to the land 25 for solder absorption to substantially the same height as the metal mask 40 while covering the solder depositions 31 centered on the openings 24b of the respective viaholes 24. Thus, even if flux F leaks to the outer surfaces of the solder depositions 31, it is substantially embedded in the cream solder 41 and does not leak out to the outer surface of the cream solder 41.

The metal mask 40 is removed after the application of the cream solder 41. At this time, the flux F does not contact the metal mask 40 since the metal mask 40 has the opening and the solder depositions 31 are embedded in the cream solder 41.

A second reflow process is carried out using the heating means to melt the cream solder 41. As a result, the cream solder 41 is secured to the solder depositions 31 of the land 25 for solder absorption. The copper foil of the land 25 for solder absorption then solidifies to form the solder layer 32.

The land 25 for solder absorption is connected through the viaholes 24 to the soldering land 22 for heat radiation. Thus, the molten solder that flows out to the second surface from the viaholes 24 can spread along the copper foil surface of the land 25 for solder absorption to prevent the formation of the solder balls projecting from the second surface.

Further, the land 25 for solder absorption is provided in a part where the molten solder flows out from the viaholes 24. Thus, the metal mask 40 to be mounted on the solder resist 26 on the second surface has the opening in its part facing the land 25 for solder absorption and, hence, the metal mask 40 is not mounted on the solder depositions 31 formed by the flown-out and solidified solder. Thus, there is no likelihood of deforming the metal mask due to solder balls or protuberances, which have been a problem of the prior art. As a result, the damage of the metal mask 40 and squeegee 38 can be prevented when applying the cream solder 41 to the outer surface of the metal mask 40 by the squeegee 38, and production efficiency can be improved.

The invention is not limited to the above embodiment. For example, even in the case where lead terminals project from the entire circumference of the case of the electronic part, a soldering land may be provided in an area surrounded by lands solder-connected to the lead terminals with the outer periphery thereof determined by a solder resist The land for solder absorption on the second surface may be larger than the soldering land for heat radiation if possible in terms of space. In such a case, heat radiation capability can be improved further.

Furthermore, the land for solder absorption having a large area may double as a ground circuit or a power supply circuit.

What is claimed is:

1. A heat radiating structure for a printed circuit board, comprising:

a substrate (12) with opposite first and second surfaces (12a; 12b) and conductor patterns (13) provided on at least one of surfaces (12a; 12b);

at least one soldering land (22) for heat radiation in an area of the first surface (12a) where an electronic part (20) is to be mounted, at least one land (25) for solder absorption on the second surface (12b) and viaholes (24) with a first opening (24a) in the soldering land (22) for heat radiation and a second opening (24b) in the land (25) for solder absorption;

a first unitary matrix of solder (36) including a solder layer (27) between the electronic part (20) and the soldering land (22) for heat radiation, the unitary matrix of solder (36) further including solder extensions (30) unitary with the solder layer (27) and extending through the viaholes (24) and a plurality of spaced apart solder depositions (31) unitary with the solder extensions (30) and spread onto areas of the land (25) for solder absorption adjacent the second opening (24b) of the respective viaholes (24) and adhering to the land (25) for solder absorption in a substantially flat manner; and a second unitary matrix of solder (41) at least partly covering portions of the solder depositions (31) adhering to the land (25) for solder absorption.

2. The heat radiating structure of claim 1, wherein the land (25) for solder absorption is at least partly registered with the soldering land (22) for heat radiation in a thickness direction (TD) of the substrate (12).

3. The heat radiating structure of claim 2, wherein the land (25) for solder absorption and the soldering land (22) for heat radiation have substantially equal surface areas.

4. The heat radiating structure of claim 1, wherein the at viaholes (24) are arranged at specified intervals in forward and backward directions and a transverse direction.

5. The heat radiating structure of claim 4, wherein an outer edge of the land (25) for solder absorption is outwardly at a specified distance from the viaholes (24).

6. The heat radiating structure of claim 1, wherein lead terminals (20b; 20c) project from the outer side surface of the electronic part (20) and are solder-connected respectively to lands (16; 17) on the first surface (12a).

7. The heat radiating structure of claim 6, wherein the electronic part (20) includes a heat radiating member (21), and the first solder matrix (36) on the soldering land (22) for heat radiation is secured substantially in surface contact with the heat radiating member (21).

\* \* \* \* \*